United States Patent
Yamamoto et al.

(10) Patent No.: US 6,946,875 B2
(45) Date of Patent: Sep. 20, 2005

(54) UNIVERSAL LOGIC MODULE AND ASIC USING THE SAME

(75) Inventors: Kenji Yamamoto, Kanagawa (JP); Masaharu Mizuno, Kanagawa (JP); Kazuhiro Nakajima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 139 days.

(21) Appl. No.: 10/325,572

(22) Filed: Dec. 19, 2002

(65) Prior Publication Data

US 2003/0117169 A1 Jun. 26, 2003

(30) Foreign Application Priority Data

Dec. 21, 2001 (JP) ....................... 2001-390321

(51) Int. Cl.[7] ............... H03K 19/094; H03K 19/173
(52) U.S. Cl. ............................ 326/50; 326/45
(58) Field of Search .................. 326/10, 13, 34, 326/44, 45, 83, 49, 50

(56) References Cited

U.S. PATENT DOCUMENTS

| 5,055,718 A | 10/1991 | Galbraith et al. | |
| 5,684,412 A | 11/1997 | Yoeli et al. | |
| 6,426,650 B1 * | 7/2002 | Dufour et al. | 326/47 |

FOREIGN PATENT DOCUMENTS

| JP | 09-199608 | 7/1997 |
| JP | 10-074917 | 3/1998 |
| JP | 2000-349159 | 12/2000 |

OTHER PUBLICATIONS

Japanese Office Action of Jan. 7, 2005.
English Translations of the Indicated Portions of the Above-reference Office Action.
Japanese Patent Office Action of Jan. 7, 2004.
English translations of indicated portions for the above-referenced office action.

* cited by examiner

*Primary Examiner*—Daniel D. Chang
(74) *Attorney, Agent, or Firm*—Darryl G. Walker; Bradley T. Sako

(57) ABSTRACT

A universal logic module that may have a reduced off-leak current in universal logic cells (100) not used as logic circuits has been disclosed. A universal logic module may include universal logic cells (100) that may be formed with a second wiring for connecting universal logic cells (100) from a base configuration formed with a first wiring. Unused universal logic cell (100) may include transistors in basic cells (A to E) that are non-connected to a power supply (VDD) and/or a ground potential (VSS). Furthermore, unused universal logic cell (100) may include transistors in basic cells (A to E) that may provide a capacitor between a power supply (VDD) and a ground potential (VSS). In this way, off-leak current may be reduced and noise on a power line and/or a ground line may be reduced.

10 Claims, 3 Drawing Sheets

| GATE LENGTH (Leff)[um] | 0.35 | 0.25 | 0.18 | 0.13 | 0.09 | 0.08 | 0.07 |
|---|---|---|---|---|---|---|---|
| POWER SOURCE CURRENT (Vcc)[V] | 3.3 | 2.5 | 1.8 | 1.5 | 1.2 | 1.2 | 0.9 |
| OFF-LEAK CURRENT (Ioff)[nA/um] | 0.01 | 0.1 | 0.5 | 5 | 8 | 10 | 13 |

FIG. 3 (BACKGROUND ART)

UNIVERSAL LOGIC MODULE AND ASIC USING THE SAME

TECHNICAL FIELD

The present invention relates generally to a universal logic module and an ASIC using the same and more particularly to a technique for forming an on-chip capacitor that may reduce noise and a technique for reducing a leak current generated by unused circuitry.

BACKGROUND OF THE INVENTION

Conventionally known universal logic modules include a general field programmable gate array (FPGA) and a mask programmable function block based gate array, as just a few examples.

A universal logic module is a semiconductor device that enables the configuration of an ASIC (application specific integrated circuit) including desired built-in logic circuits. A configuration is built in such a manner that transistors (for example, MOS (metal-oxide-semiconductor) transistors) formed on a semiconductor substrate are electrically connected via m wiring layers (m represents an integer equal to or greater than one). In this way, basic circuits called "universal logic cells" are configured in a logic array. Then, with the above configuration being used as a base, the universal logic cells are electrically connected using n wiring layers (n represents an integer equal to or greater than 1). Generally, the basic circuit includes logic circuits having small-scale logic functions, such as inverter circuits, NAND circuits, NOR circuit, and multiplexers, for example.

When the universal logic module is used, wiring patterns of the n layers can be designed to realize desired logic circuits and a semiconductor chip (integrated circuit) on which the desired logic circuits are formed can be obtained according to a semiconductor manufacturing procedure. In this case, the manufacturing procedure uses lithography masks on which the desired m wiring patterns are printed and the n wiring layers can be formed on a semiconductor substrate on which the base configuration has been formed.

The universal logic module is used as described hereunder. For example, a semiconductor manufacturer discloses information of the base configuration to a user. The user then designs the desired logic circuits according to the information disclosed and requests the semiconductor manufacturer to manufacture a semiconductor chip that includes the desired logic circuits. In response, the semiconductor manufacturer performs automatic design of patterns of the n wiring layers in compliance with the requirements received from the user for the desired logic circuits. Then, the manufacturer manufactures the semiconductor chip.

As a universal logic module of the type describe above, for example, Japanese Patent Application Laid-open No. Hei 7-106949 (U.S. Pat. No. 5,055,718) discloses a "Universal Combinatory Logic Module" consisting of a four-input multiplexer (MUX) formed by combining three two-input multiplexers. As a universal logic module of another type, U.S. Pat. No. 5,684,412 discloses a "Cell Forming Part of a Customizable Array." Further, Japanese Patent Application Laid-open No. Sho 61-61437 discloses a master-slice type integrated circuit that uses storage areas not used for logic functions to work as by-pass capacitors between VDD and GND. Furthermore, Japanese Patent Application Laid-open No. Hei 2-241061 discloses a CMOS gate array that includes noise-absorbing by-pass capacitor between a power supply potential and a ground potential.

In the above-mentioned conventional universal logic modules, MOS transistors included in universal logic cells include those individually pre-connected to a power supply (VDD) line and a ground (GND) line. Thus, the MOS transistor includes a leak current between the source and a drain. Thus, leak currents occur in MOS transistors that are in non-connected or non-used circuits included in the universal logic cell.

Referring now to FIG. 3, a table illustrating the relationships among gate lengths (Leff), power supply voltage (Vcc), and an off-leak current (Ioff) of MOS transistors is set forth. An off-leak current is a leak current when the MOS transistor is turned off. As shown in FIG. 3, the off-leak current increases as the gate length decreases even if the power supply voltage decreases. Therefore, in recent years miniaturization has reached an advanced level where current consumption due to off-leak current cannot be ignored.

Reportedly, when logic circuits are formed using a universal logic module in which a large number of universal logic cells are integrated, the ratio universal logic cells actually used to non-used universal logic cells is about 50%. Hence, the not-used universal logic cells use a large amount of power in a universal logic module.

In addition, the operating frequency of an ASIC in recent years has increased. The increase in operating frequency results in an increase in noise generated in power lines due to the switching operation of transistors, such as MOS transistors, in a universal logic module. This increase noise generated in power lines can cause improper operations or malfunctions.

In view of the above discussion, it would be desirable to provide a universal logic module that may prevent leak current from being generated in a universal logic cell that is not used in a logic circuit and to provide an ASIC using the universal logic module.

SUMMARY OF THE INVENTION

According to the present embodiments, a universal logic module that may have a reduced off-leak current in universal logic cells not used as logic circuits is disclosed. A universal logic module may include universal logic cells that may be formed with a second wiring for connecting universal logic cells from a base configuration formed with a first wiring. Unused universal logic cells may include transistors in basic cells that are non-connected to a power supply and/or a ground potential. Furthermore, unused universal logic cells may include transistors in basic cells that may provide a capacitor between a power supply and a ground potential. In this way, off-leak current may be reduced and noise on a power line and/or a ground line may be reduced.

According to one aspect of the embodiments, a universal logic module forming an application specific integrated circuit (ASIC) may include a plurality of universal logic cells. The plurality of universal logic cells may be at least partially connected with a first wiring to form a base configuration in the form of an array. A second wiring may be formed on the base configuration. A second wiring may provide a connection between at least two of the plurality of universal logic cells. At least one of the plurality of logic cells not used may have at least one of a terminal for receiving a power supply potential and a terminal for receiving a ground potential set non-connected. In this way, a leak current may be reduced.

According to another aspect of the embodiments, in the base configuration, each of the plurality of universal logic cells may be non-connected to at least one of the power supply potential and the ground potential.

According to another aspect of the embodiments, each universal logic cell may include a plurality of insulated gate field effect transistors (IGFETs). At least one of the plurality of universal logic cells not used may have at least on of the plurality of IGFETs configured to form an on-chip capacitor.

According to another aspect of the, embodiments, an on-chip capacitor may include a first capacitor terminal electrically connected to the power supply potential and a second capacitor terminal electrically connected to the ground potential.

According to another aspect of the embodiments, at least one of the plurality of IGFETs configured to form an on-chip capacitor may be a p-type IGFET. The p-type IGFET may have a gate electrically connected to a ground potential and a source electrically connected to a power supply potential.

According to another aspect of the embodiments, at least one of the plurality of IGFETs configured to form an on-chip capacitor may be a n-type IGFET. The n-type IGFET may have a gate electrically connected to a power supply potential and a source electrically connected to a ground potential.

According to another aspect of the embodiments, an ASIC manufacturing method may include the steps of forming a base configuration and forming logic circuits. A base configuration may include a plurality of universal logic cells in the form of an array and at least partially connected with a first wiring. Each universal logic cell may include a terminal for receiving a power supply potential and a terminal for receiving a ground potential. Logic circuits may be formed by forming a second wiring on the base configuration to provide a connection between at least two of the plurality of universal logic cells. At least two of the plurality of universal logic cells may have a terminal for receiving a power supply potential electrically connected to receive the power supply potential and a terminal for receiving a ground potential electrically connected to receive the ground potential. At least one of the plurality of universal logic cells not used may have at least one of the terminal for receiving the power supply potential and the terminal for receiving the ground potential set non-connected.

According to another aspect of the embodiments, a step of forming a base configuration may include forming each universal logic circuit to include a plurality of IGFETs. A step of forming a second wiring may include configuring an on-chip capacitor from at least one of a plurality of IGFETs in the at least one of a plurality of universal logic cells not used.

According to another aspect of the embodiments, in a base configuration, each of a plurality of universal logic cells may be non-connected to the power supply potential and a ground potential. At least one p-type IGFET from at least one of a plurality of logic cells not used may form a first on-chip capacitor to provide capacitance between the power supply potential and the ground potential. At least one n-type IGFET from at least one of a plurality of logic cells not used may form a second on-chip capacitor to provide capacitance between the power supply potential and the ground potential.

According to another aspect of the embodiments, an ASIC designing method for designing an ASIC formed to include a universal logic module in which logic circuits may be formed by a second wiring formed on a base configuration to provide a connection between at least two of a plurality of universal logic cells and in the base configuration, the plurality of universal logic cells are in the form of an array and at least partially connected with a first wiring, the ASIC designing method may include the steps of designing at least one first wiring mask and designing at least one second wiring mask. An at least one first wiring mask may be designed for a first wiring so a terminal for receiving a power supply potential and a terminal for receiving a ground potential in at least one of the universal logic cells may be set non-connected in the base configuration. An at least one second wiring mask may be designed for a second wiring so that at least two of a plurality of universal logic cells forming the logic circuit may have a terminal for receiving a power supply potential electrically connected to receive the power supply potential and a terminal for receiving the ground potential may be electrically connected to receive the ground potential and at least one of the plurality of universal logic cells not used may have at least one of the terminal for receiving the power supply potential and the terminal for receiving the ground potential set non-connected.

According to another aspect of the embodiments, an at least one first wiring mask may be designed so that, in a base configuration, each of a plurality of universal logic cells may be non-connected to at least one of a power supply potential and a ground potential.

According to another aspect of the embodiments, a step of designing at least one second wiring mask may be performed so that, in the ASIC, an on-chip capacitor may be formed from at least one of a plurality of IGFETs in at least one of a plurality of universal logic cells not used and the on-chip capacitor may have an electrical connection to at least one of the power supply potential and the ground potential.

According to another aspect of the embodiments, an ASIC providing method for providing an ASIC to a user may include the steps of providing the user with information about a base configuration, forming logic circuits according to information provided by the user, and providing the ASIC to the user. A base configuration may include a plurality of universal logic cells in the form of an array and at least partially connected with a first wiring. Each universal logic cell may include a terminal for receiving a power supply potential and a terminal for receiving a ground potential. Logic circuit may be formed by forming a second wiring on the base configuration to provide a connection between at least two of the plurality of universal logic cells. At least two of the plurality of universal logic cells may have a terminal for receiving a power supply potential electrically connected to receive the power supply potential and a terminal for receiving a ground potential electrically connected to receive the ground potential. At least one of the plurality of universal logic cells not used may have at least one of the terminal for receiving the power supply potential and the terminal for receiving the ground potential set non-connected.

According to another aspect of the embodiments, the ASIC providing method may include forming on-chip capacitors according to information provided by the user from at least one of a plurality of IGFETs in at least one of a plurality of universal logic cells not used and the on-chip capacitor may have an electrical connection to at least one of the power supply potential and the ground potential.

BRIEF DESCRIPTION OF THE DRAWINGS

FIG. 1A is a diagram showing an array of universal logic cells.

FIG. 3 is a table illustrating the relationships among gate lengths (Leff), power supply voltage (Vcc), and an off-leak current (Ioff) of a MOS transistor.

DETAILED DESCRIPTION OF THE EMBODIMENTS

Various embodiments of the present invention will now be described in detail with reference to a number of drawings.

A universal logic module according to an embodiment may be configured to provide desired logic circuits in such a manner that IGFETs (insulated gate field effect transistors) formed on a semiconductor substrate may be electrically connected via a first wiring formed of, for example, three layers, and basic circuits known as "universal logic cells" may be thereby formed in an array of universal logic cells. Then, using the above formation as a base, the universal logic cells may be electrically connected via a second wiring formed of, for example, two layers. The present specification may refer to an IC (integrated circuit) formed using universal logic modules including built-in logic circuits as an "ASIC". In embodiments, a universal logic cell may include an inverting-type two-input multiplexer, however, the present invention is not limited thereby and various other logic circuits may be included in or used as universal logic cells.

FIG. 1A shows universal logic cells (ULCs) connected with a first wiring to form a base configuration of an array. A second wiring is formed on the base configuration to provide a connection between two or more universal logic cells (ULCs).

FIG. 1A shows universal logic cells (ULCs) connected with a first wiring to form a base configuration of an array. A second wiring is formed on the base configuration to provide a connection bhetween two or more universal logic cells (ULCs).

Figure 1:
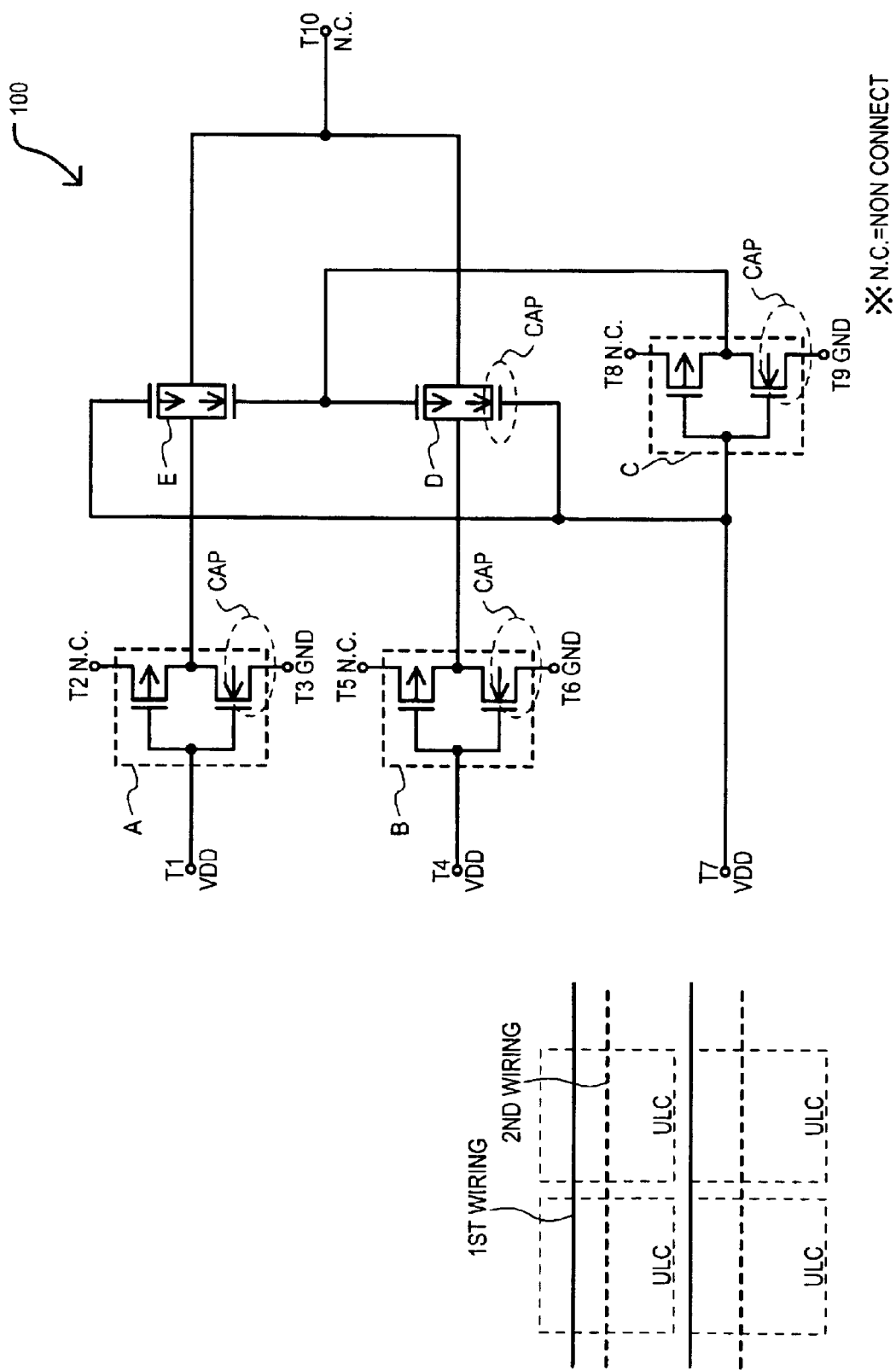
FIG. 1 is a circuit schematic diagram of a universal logic cell according to an embodiment.

Referring now to FIG. 1, a circuit schematic diagram of a universal logic cell according to an embodiment is set forth and given the general reference character 100. Universal logic cell 100 may be used to form a universal logic module. Universal logic cell 100 may include basic cells (A, B, C, D, and E). Basic cells (A, B, C, D, and E) may be connected via a first wiring. The first wiring may include three layers, for example. A second wiring may be used provide connections of signals or power supply potentials to terminals (T1 to T10) in universal logic cell 100. A second wiring may include two layers, for example.

Each basic cell (A, B, and C) may include a p-type IGFET and a n-type IGFET and more particularly may include a p-channel MOS (metal-oxide-semiconductor) FET and a n-channel MOSFET. Each p-type IGFET and n-type IGFET included in each of basic cells (A, B, and C) may correspond to a transistor of the present invention.

First a base configuration of universal logic cell 100 will be described.

In a base configuration, a first wiring may include for example three layers and interconnections may be made with a first wiring.

Basic cell A may include a p-type IGFET and an n-type IGFET. A p-type IGFET in basic cell A may have a source connected to a terminal T2, a drain commonly connected to a drain of a n-type IGFET in basic cell A. An n-type IGFET in basic cell A may have a source connected to a terminal T3. Terminal T3 may be connected to a ground potential GND. A gate of an n-type IGFET and a p-type IGFET in basic cell A may be commonly connected to a terminal T1. The commonly connected drains of n-type and p-type IGFETs in basic cell A may be connected to basic cell E. At this time, terminals (T1, and T2) may be non-connected.

Basic cell B may include a p-type IGFET and an n-type IGFET. A p-type IGFET in basic cell B may have a source connected to a terminal T5, a drain commonly connected to a drain of an n-type IGFET in basic cell B. An n-type IGFET in basic cell B may have a source connected to a terminal T6. Terminal T6 may be connected to a ground potential GND. A gate of an n-type IGFET and a p-type IGFET in basic cell B may be commonly connected to a terminal T4. The commonly connected drains of n-type and p-type IGFETs in basic cell B may be connected to basic cell D. At this time, terminals (T4 and T5) may be non-connected.

Basic cell C may include a p-type IGFET and an n-type IGFET. A p-type IGFET in basic cell C may have a source connected to a terminal T8, a drain commonly connected to a drain of a n-type IGFET in basic cell C. An n-type IGFET in basic cell C may have a source connected to a terminal T9. Terminal T9 may be connected to a ground potential GND. A gate of an n-type IGFET and a p-type IGFET in basic cell C may be commonly connected to a terminal T7. The commonly connected drains of n-type and p-type IGFETs in basic cell C may be connected to basic cells (D and E). At this time, terminals (T7 and T8) may be non-connected.

Basic cell E may include a p-type IGFET and an n-type IGFET. A p-type IGFET in basic cell E may have a first source/drain commonly connected to a first source/drain of an n-type IGFET in basic cell E and commonly connected drains of n-type and p-type IGFETs in basic cell A. A p-type IGFET in basic cell E may have a second source/drain commonly connected to a second source/drain of an n-type IGFET in basic cell E and terminal T10. A gate of a p-type IGFET in basic cell E may be connected to terminal T7. A gate of an n-type IGFET in basic cell E may be connected to commonly connected drains of n-type and p-type IGFETs in basic cell C.

Basic cell D may include a p-type IGFET and an n-type IGFET. A p-type IGFET in basic cell D may have a first source/drain commonly connected to a first source/drain of an n-type IGFET in basic cell D and commonly connected drains of n-type and p-type IGFETs in basic cell B. A p-type IGFET in basic cell D may have a second source/drain commonly connected to a second source/drain of an n-type IGFET in basic cell D and terminal T10. A gate of an n-type IGFET in basic cell D may be connected to terminal T7. A gate of a p-type IGFET in basic cell D may be connected to commonly connected drains of n-type and p-type IGFETs in basic cell C. At this time terminal T10 may be non-connected.

Thus, a base configuration of universal logic cell 100 may be formed.

It is noted, that although terminals (T3, T6, and T9) have been connected to a ground potential GND during the formation of a base configuration, alternatively, terminals (T3, T6, and T9) may also be non-connected (N.C.) at this time and may be later connected to ground with a second wiring during the configuration of an ASIC in accordance to user specifications, for example.

When universal logic cell 100 is configured to be used by a user (via a second wiring), basic cells (A, B, and C) may be inverters and basic cells (D and E) may be transfer gates and together may form a multiplexer to select one of the outputs of basic cells (A and B). In this case, terminals (T2, T5, and T8) may be connected to a power supply VDD via a second wiring. Terminals (T1, T4, and T7) may be configured to receive respective input signals via a second wiring. Terminal T10 may be connected to provide an output signal via a second wiring. In this way, universal logic cell 100 may be configured to be capable of exhibiting various functions depending upon whether terminals (T1, T2, T4, T5, T7, T8 and T10) are connected or non-connected (N.C.).

Note, in universal logic cell 100, terminals (T3, T6, and T9) may be connected to a ground potential GND via a first wiring in the formation of a base configuration or alternatively, may be connected to a ground potential GND via a second wiring in the formation of an integrated circuit for the user.

For example, upon connection of terminal T2, terminal T5, and terminal T8 to a power supply VDD, a two-input multiplexer of an inverting output type may be formed in which a first stage may include an inverter and a second stage may include a transfer gate. In this case, terminals (T1 and T4) may be used as input terminals, terminal T7 may be used as a selection control terminal, and terminal T10 may be used as an output terminal.

With a multiplexer as described above being used, various logic devices may be configured depending on the connection of terminals (T1, T4, T7, and T10). Some examples of logic elements configured in a universal logic cell are described in Japanese Patent Application No. 2000-319269 previously filed by the present applicant.

However, when universal logic cell 100 in a universal logic module is not needed by a user, terminals (T2, T5, T8, and T10) may remain non-connected (N.C). However, terminals (T1, T4, and T7) may be connected to a power supply VDD via a second wiring. Because n-type IGFETs in logic cells (A, B, and C) have a source connected to a ground potential and a gate connected to a power supply VDD, an inversion layer (channel) may be formed. Thus, n-type IGFETs in logic cells (A, B, and C) may form a capacitor between power supply VDD and a ground potential GND. Also, with n-type IGFET in logic cell B turned on, a ground potential may be provided to a first source/drain of an n-type IGFET in logic cell D. Thus, with terminal T7 connected to a power supply VDD, an n-type IGFET in logic cell D may be turned on and may form a capacitor between power supply VDD and a ground potential GND. With n-type IGFETs in logic cells (A, B, C, and D) forming a capacitor between power supply VDD and a ground potential GND, charge may be stored on a power supply line or a ground line in a position relatively close to circuitry being used and noise (power supply fluctuations) may be reduced.

A universal logic module according to the embodiment of FIG. 1 may be configured by integrating a plurality of universal logic cells 100 individually configured as described above. With such a universal logic module being used, an ASIC including logic circuits having desired functions may be configured when a second wiring for connecting universal logic cells is formed on a base configuration of universal logic cells formed such that portions thereof are connected via a first wiring and disposed in an array. In a base configuration, sources of p-type IGFETs in basic cells (A, B, and C) may be non-connected. On the other hand, if an individual universal logic cell 100 is not used to form logic circuits, gates of IGFETs in basic cells (A to D) may be connected to a power supply VDD via a second wiring. In this way, on-chip capacitors may be formed.

To fabricate an ASIC using a universal logic module as described above, a base configuration may be formed for the use of disposing universal logic cells in an array by connecting portions thereof via a first wiring. Then, a second wiring to which universal logic cells are connected may be formed on the base configuration as described above and logic circuits can thereby be formed. When forming a base configuration, sources of p-type IGFETs included in individual universal logic cells may be set as non-connected to a power supply VDD. When forming the logic circuits, gates of IGFETs included individual universal logic cells not used may be connected to a power supply VDD via a second wiring. In this way, on chip capacitors may thereby be formed.

When designing an ASIC using universal logic modules as described above, wiring patterns of a second wiring may be designed to realize desired logic circuits. A semiconductor chip in which desired logic circuits are formed may be obtained in accordance with a semiconductor manufacturing procedure which employs a lithography mask (or masks) on which the above second wiring can be printed. In this way, a second wiring may be formed on a semiconductor substrate including a base configuration in which up to three layers may be formed as wiring layers.

An ASIC using the universal logic modules as described above can be provided to a user according to a method described hereunder. For example, a semiconductor manufacturer can disclose, to the user, the base configuration including up to three layers wiring layers formed. The user may design desired logic circuit according to the information disclosed and may request the semiconductor manufacturer to manufacture a semiconductor chip that realizes the desired logic circuits. In response, the semiconductor manufacturer may perform an automatic design of two layers of wiring patterns in compliance with the requirements for the logic circuits, which have been received from the user. Then, the manufacturer may manufacture a semiconductor chip as described above and provide the chip to the user.

As described above, in the universal logic module according to an embodiment as shown in FIG. 1, because terminals (T2, T5, and T8) of universal logic cells not included in logic circuits may be set non-connected, electrical connections through non-used universal logic cells 100 between a power supply VDD and ground potential GND may be essentially eliminated. Thus, leak currents of IGFETs (off-leak currents) included in the unused universal logic cells may be suppressed substantially to zero. In this way, overall power consumption may be suppressed in the ASIC.

For example, as shown in FIG. 3, when a gate length (Leff) is 0.13 $\mu$m, and a power supply voltage Vcc is 1.5 V, an off-leak current (Ioff) is about 5 nA/$\mu$m. An assumption is made such that the gate width is 1.6 $\mu$m in a chip having a size of 10M gates (40M transistors, where M=$10^6$), 50% of the gates are not used to constitute logic circuits. In this case, a per-chip reduction in current consumption may be expressed as "5[nA/$\mu$m]*1.6[$\mu$m]*(40*$10^6$[Tr(transistors)])*0.5=160[mA]".

Upon connection of terminals (T1, T4, and T7) of the above-described universal logic cells 100 to a power supply VDD, the individual n-type IGFETs of basic cells (A, B, C, and D) in unused universal logic cells 100 may function as a capacitor CAP. Capacitors CAP may be provided between a power supply VDD and ground GND. Such capacitors CAP may provide an essentially instantaneous charge source for circuit operations and may therefore dampen or suppress power-line and/or ground line noise attributed to switching operations. In this way, circuit operations may be improved and malfunctions may be reduced.

For example, in a chip having a size of 10M gates (40M transistors) and 50% of gates are used as on-chip capacitors, a capacitance value provided may be as follows. Because each universal logic cell may include 10 transistors, when the gate capacitance is assumed to be 2.5 fF, the total capacitance value added may be expressed as "2.5[fF]* (40*10⁶[Tr]*0.5=50[nF]".

Figure 2:
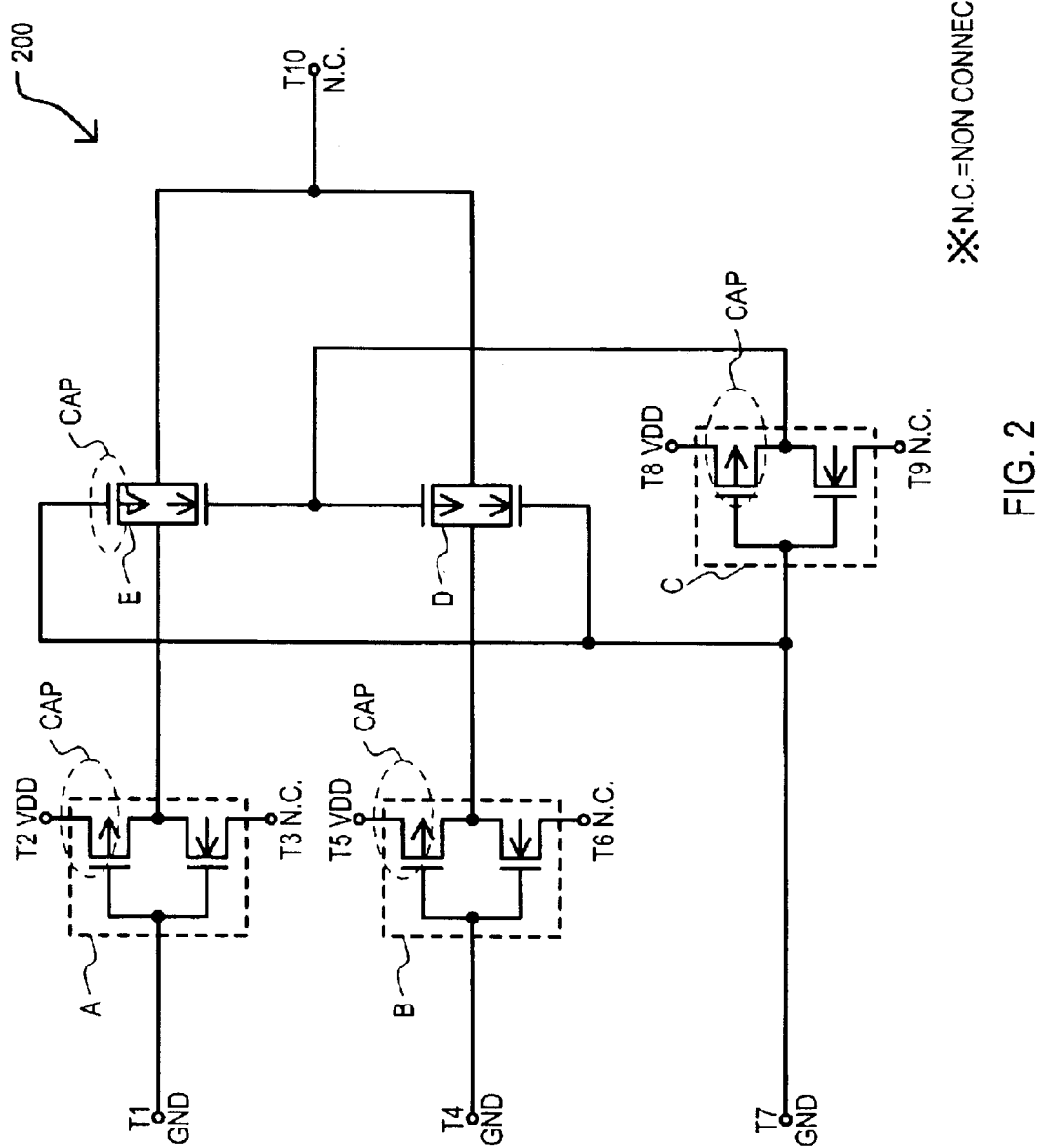
FIG. 2 is a circuit schematic diagram of a universal logic cell according to an embodiment.

Referring now to FIG. 2, a circuit schematic diagram of a universal logic cell according to an embodiment is set forth and given the general reference character 200. Universal logic cell 200 may include similar constituents as universal logic cell 100 and such constituents may be referred to by the same reference characters. Universal logic cell 200 may include basic cells (A, B, C, D, and E).

The base configuration of universal logic cell 200 may differ from the base configuration of universal logic cell 100 in that terminals (T3, T6, and T9) may be non-connected (N.C.) and terminals (T2, T5, and T8) may be connected to power supply VDD. Otherwise the base configuration of universal logic cell 200 may be essentially the same as the base configuration of universal logic cell 100. Likewise, in a base configuration, a first wiring may include, for example, three layers and interconnections may be made with a first wiring.

A base configuration of universal logic cell 200 will now be described.

In a base configuration, a first wiring may include, for example, three layers and interconnections may be made with a first wiring.

Basic cell A may include a p-type IGFET and an n-type IGFET. A p-type IGFET in basic cell A may have a source connected to a terminal T2, a drain commonly connected to a drain of an n-type IGFET in basic cell A. An n-type IGFET in basic cell A may have a source connected to a terminal T3. Terminal T2 may be connected to a power supply VDD. A gate of an n-type IGFET and a p-type IGFET in basic cell A may be commonly connected to a terminal T1. The commonly connected drains of n-type and p-type IGFETs in basic cell A may be connected to basic cell E. At this time, terminals (T1 and T3) may be non-connected.

Basic cell B may include a p-type IGFET and an n-type IGFET. A p-type IGFET in basic cell B may have a source connected to a terminal T5, a drain commonly connected to a drain of an n-type IGFET in basic cell B. An n-type IGFET in basic cell B may have a source connected to a terminal T6. Terminal T5 may be connected to a power supply VDD. A gate of an n-type IGFET and a p-type IGFET in basic cell B may be commonly connected to a terminal T4. The commonly connected drains of n-type and p-type IGFETs in basic cell B may be connected to basic cell D. At this time, terminals (T4 and T6) may be non-connected.

Basic cell C may include a p-type IGFET and an n-type IGFET. A p-type IGFET in basic cell C may have a source connected to a terminal T8, a drain commonly connected to a drain of an n-type IGFET in basic cell C. An n-type IGFET in basic cell C may have a source connected to a terminal T9. Terminal T8 may be connected to a power supply VDD. A gate of an n-type IGFET and a p-type IGFET in basic cell C may be commonly connected to a terminal T7. The commonly connected drains of n-type and p-type IGFETs in basic cell C may be connected to basic cells (D and E). At this time, terminals (T7 and T9) may be non-connected.

Basic cell E may include a p-type IGFET and an n-type IGFET. A p-type IGFET in basic cell E may have a first source/drain commonly connected to a first source/drain of an n-type IGFET in basic cell E and commonly connected drains of n-type and p-type IGFETs in basic cell A. A p-type IGFET in basic cell E may have a second source/drain commonly connected to a second source/drain of an n-type IGFET in basic cell E and terminal T10. A gate of a p-type IGFET in basic cell E may be connected to terminal T7. A gate of an n-type IGFET in basic cell E may be connected to commonly connected drains of n-type and p-type IGFETs in basic cell C.

Basic cell D may include a p-type IGFET and an n-type IGFET. A p-type IGFET in basic cell D may have a first source/drain commonly connected to a first source/drain of an n-type IGFET in basic cell D and commonly connected drains of n-type and p-type IGFETs in basic cell B. A p-type IGFET in basic cell D may have a second source/drain commonly connected to a second source/drain of an n-type IGFET in basic cell D and terminal T10. A gate of an n-type IGFET in basic cell D may be connected to terminal T7. A gate of a p-type IGFET in basic cell D may be connected to commonly connected drains of n-type and p-type IGFETs in basic cell C. At this time terminal T10 may be non-connected.

Thus, a base configuration of universal logic cell 200 may be formed.

It is noted, that although terminals (T2, T5, and T8) have been connected to a power supply VDD during the formation of a base configuration, alternatively, terminals (T2, T5, and T8) may also be non-connected (N.C.) at this time and may be later connected to ground with a second wiring during the configuration of an ASIC in accordance to user specifications, for example.

When universal logic cell 200 is configured to be used by a user (via a second wiring), basic cells (A, B, and C) may be inverters and basic cells (D and E) may be transfer gates and together may form a multiplexer to select one of the outputs of basic cells (A and B). In this case, terminals (T3, T6, and T9) may be connected to a ground potential GND via a second wiring. Terminals (T1, T4, and T7) may be configured to receive respective input signals via a second wiring. Terminal T10 may be connected to provide an output signal via a second wiring. In this way, universal logic cell 200 may be configured to be capable of exhibiting various functions depending upon whether terminals (T1, T3, T4, T6, T7, T9 and T10) are connected or non-connected (N.C.).

For example, upon connection of terminal T3, terminal T6, and terminal T9 to a ground potential GND, a two-input multiplexer of an inverting output type may be formed in which a first stage may include an inverter and a second stage may include a transfer gate. In this case, terminals (T1 and T4) may be used as input terminals, terminal T7 may be used as a selection control terminal, and terminal T10 may be used as an output terminal.

With a multiplexer as described above being used, various logic devices may be configured depending on the connection of terminals (T1, T4, T7, and T10).

However, when universal logic cell 200 in a universal logic module is not needed by a user, terminals (T3, T6, T9, and T10) may remain non-connected (N.C). However, terminals (T1, T4, and T7) may be connected to a ground potential GND via a second wiring. Because p-type IGFETs in logic cells (A, B, and C) have a source connected to a power supply VDD and a gate connected to a ground potential GND, an inversion layer (channel) may be formed. Thus, p-type IGFETs in logic cells (A, B, and C) may form a capacitor between a power supply VDD and a ground potential GND. Also, with p-type IGFET in logic cell A turned on, a power supply VDD may be provided to a first source/drain of a p-type IGFET in logic cell E. Thus, with terminal T7 connected to a ground potential VSS, a p-type IGFET in logic cell E may be turned on and may form a capacitor between power supply VDD and a ground potential GND. With n-type IGFETs in logic cells (A, B, C, and D) forming a capacitor between power supply VDD and a ground potential GND, charge may be stored on a power supply line or ground line in a position relatively close to circuitry being used and noise (power supply fluctuations) may be reduced.

A universal logic module according to the embodiment of FIG. 2 may be configured by integrating a plurality of universal logic cells 200 individually configured as described above. With such a universal logic module being used, an ASIC including logic circuits having desired functions may be configured when a second wiring for connecting universal logic cells is formed on a base configuration of universal logic cells formed such that portions thereof are connected via a first wiring and disposed in an array. In a base configuration, sources of n-type IGFETs in basic cells (A, B, and C) may be non-connected. On the other hand, if an individual universal logic cell 200 is not used to form logic circuits, gates of IGFETs in basic cells (A, B, C, and E) may be connected to a ground potential VSS via a second wiring. In this way, on-chip capacitors may be formed.

As described above, in the universal logic module according to an embodiment as shown in FIG. 2, because terminals (T3, T6, and T9) of universal logic cells not included in logic circuits may be set non-connected, electrical connections through non-used universal logic cells 200 between a power supply VDD and ground potential GND may be essentially eliminated. Thus, leak currents of IGFETs (off-leak currents) included in the unused universal logic cells may be suppressed substantially to zero. In this way, overall power consumption may be suppressed in the ASIC.

Upon connection of terminals (T1, T4, and T7) of the above-described universal logic cells 200 to a ground potential VSS, the individual p-type IGFETs of basic cells (A, B, C, and E) in unused universal logic cells 200 may function as a capacitor CAP. Capacitors CAP may be provided between a power supply VDD and ground GND. Such capacitors CAP may provide an essentially instantaneous charge source for circuit operations and may therefore dampen or suppress power-line and/or ground line noise attributed to switching operations. In this way, circuit operations may be improved and malfunctions may be reduced.

As described above according to the embodiments, a universal logic module may have a reduced off-leak current in universal logic cells not used as logic circuits. Further, the invention may enable the provision of an ASIC using an aforementioned universal logic module. Furthermore, transistors in universal logic cells set non-connected and not used to logically function may noise suppression on power lines and/or ground lines. In this way, device operation may be stabilized.

It is understood that the embodiments described above are exemplary and the present invention should not be limited to those embodiments. Specific structures should not be limited to the described embodiments.

For example, the embodiments of FIGS. 1 and 2 may be used on the same semiconductor device. In this way, capacitors formed from n-type IGFETs and p-type IGFETs may be formed on the same device.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A universal logic module forming an application specific integrated circuit (ASIC), comprising:

a plurality of universal logic cells at least partially connected with a first wiring to form a base configuration in the form of an array;

a second wiring formed on the base configuration to provide a connection between at least two of the plurality of universal logic cells wherein at least one of the plurality of universal logic cells not used has at least one of a terminal for receiving a power supply potential and a terminal for receiving a ground potential set non-connected so that a leak current can be reduced, the at least one universal logic cell that is not used having at least one insulated gate field effect transistor (IGFET) configured to form an on-chip capacitor with a first capacitor terminal electrically connected to the power supply potential and a second capacitor terminal electrically connected to the ground potential.

2. The universal logic module according to claim 1, wherein:

in the base configuration, each of the plurality of universal logic cells is non-connected to at least one of the power supply potential and the ground potential.

3. The universal logic module according to claim 1, wherein:

each universal logic cell includes a plurality of insulated gate field effect transistors (IGFETs).

4. The universal logic module according to claim 1, wherein:

the at least one of the plurality of IGFETs configured to form the on-chip capacitor is a p-type IGFET having a gate electrically connected to the ground potential and a source electrically connected to the power supply potential.

5. The universal logic module according to claim 1, wherein:

the at least one of the plurality of IGFETs configured to form the on-chip capacitor is an n-type IGFET having a gate electrically connected to the power supply potential and a source electrically connected to the ground potential.

6. An application specific integrated circuit (ASIC) manufacturing method, comprising the steps of:

forming a base configuration including a plurality of universal logic cell, each comprising a plurality of insulated gate field effect transistors (IGFETs), in the form of an array and at least partially connected with a first wiring, each universal logic cell including a terminal for receiving a power supply potential and a terminal for receiving a ground potential; and forming logic circuits by forming a second wiring on the base configuration to provide a connection between at least two of the plurality of universal logic cells wherein the at least two of the plurality of logic cells has the terminal for receiving the power supply potential electrically connected to receive the power supply potential and the terminal for receiving the ground potential electrically connected to receive the ground potential and at least one of the plurality of universal logic cells not used has at least one of the terminal for receiving the power supply potential and the terminal for receiving the ground potential set non-connected; wherein the step of forming the second wiring further includes donfiguring an on-chip capacitor from at least one of a plurality of IGFETs in the at least one of the plurality of universal logic cells not used, the on-chip capacitor having a first capacitor terminal electrically connected to the power supply potential and a second capacitor terminal electrically connected to the ground potential.

7. The ASIC manufacturing method according to claim 6, wherein:

in the base configuration, each of the plurality of universal logic cells is non-connected to at least one of the power supply potential and the ground potential.

8. The ASIC munufacturing method according to claim 6, wherein:

the at least one of the plurality of IGFETs configured to form the on-chip capacitor is a p-type IGFET having a gate electrically connected to the ground potential and a source electrically connected to the power supply potential.

9. The ASIC manufacturing method according to claim 6, wherein:

the at least one of the plurality of IGFETs configured to form the on-chip capacitor is an n-type IGFET having a gate electrically connected to the power supply potential and a source electrically connected to the ground potential.

10. The ASIC manufacturing method according to claim 6, wherein:

in the base configuration, each of the plurality of universal logic cells is non-connected to the power supply potential and the ground potential;

at least one p-type IGFET from at least one of the plurality of logic cells not used forms a first on-chip capacitor to provide capacitance between the power supply potential and the ground potential; and at least one n-type IGFET from at least one of the plurality of logic cells not used forms a second on-chip capacitor to provide capacitance between the power supply potential and the ground potential.

* * * * *